United States Patent [19]

Morse et al.

[11] Patent Number: 5,280,173
[45] Date of Patent: Jan. 18, 1994

[54] ELECTRIC AND ELECTROMAGNETIC FIELD SENSING SYSTEM INCLUDING AN OPTICAL TRANSDUCER

[75] Inventors: Theodore F. Morse; Alexis Mendez, both of Providence, R.I.

[73] Assignee: Brown University Research Foundation, Providence, R.I.

[21] Appl. No.: 828,565

[22] Filed: Jan. 31, 1992

[51] Int. Cl.⁵ .................... H01J 5/16; G01D 5/34; G01B 9/02
[52] U.S. Cl. .................... 250/227.23; 250/227.27; 250/231.1; 385/12; 356/352; 324/96; 324/244.1
[58] Field of Search .................... 250/227.21, 227.23, 250/227.27, 231.1, 226, 227.19, 227.11; 385/12, 13; 356/352, 357, 358; 324/96, 244.1, 457

[56] References Cited

U.S. PATENT DOCUMENTS

| | | | |
|---|---|---|---|
| H371 | 11/1987 | Bobb | 324/244 |
| 4,467,656 | 8/1984 | Mallon et al. | 73/727 |
| 4,477,723 | 10/1984 | Carome et al. | 250/227 |
| 4,570,064 | 2/1986 | Nagatsuma et al. | 250/231 R |
| 4,595,876 | 6/1986 | Kuhara et al. | 324/96 |
| 4,617,608 | 10/1986 | Blonder et al. | 361/291 |
| 4,631,402 | 12/1986 | Nagatsuma et al. | 250/231 R |
| 4,678,902 | 7/1987 | Perlin | 250/227.21 |
| 4,682,500 | 7/1987 | Uda | 250/231.19 |
| 4,730,109 | 3/1988 | Afromowitz | 250/226 |
| 4,743,119 | 5/1988 | Ida | 356/372 |
| 4,746,791 | 5/1988 | Forkel | 250/231.13 |
| 4,772,786 | 9/1988 | Langdon | 250/231.1 |
| 4,774,406 | 9/1988 | Chollet et al. | 250/227 |
| 4,825,262 | 4/1989 | Mallinson | 356/352 |
| 4,868,495 | 9/1989 | Einzig et al. | 324/97 |
| 4,873,485 | 10/1989 | Williamson | 324/96 |
| 4,875,006 | 10/1989 | Henley et al. | 324/158 R |
| 4,897,542 | 1/1990 | Dakin et al. | 250/227.21 |
| 4,899,042 | 2/1990 | Falk et al. | 250/227 |
| 4,926,696 | 5/1990 | Haritonidis et al. | 250/231.19 |
| 4,929,830 | 5/1990 | Bohnert et al. | 250/227.14 |
| 4,933,629 | 6/1990 | Kozuka et al. | 324/96 |
| 4,939,447 | 7/1990 | Bohnert et al. | 324/96 |
| 4,945,230 | 7/1990 | Saaski et al. | 250/227.21 |
| 4,951,106 | 8/1990 | Blouke | 357/30 |
| 4,956,607 | 9/1990 | Abe et al. | 324/244 |
| 5,119,024 | 6/1992 | Popovic et al. | 250/227.11 |
| 5,128,537 | 7/1992 | Hälg | 250/231.19 |
| 5,152,173 | 10/1992 | Willson | 250/231.19 |

FOREIGN PATENT DOCUMENTS

0440268 8/1991 European Pat. Off. ............ 356/352

OTHER PUBLICATIONS

Ko et al., "Development of a Miniature Pressure Transducer for Biomedical Applications", *IEEE Transactions on Electron Devices*, vol. ED-26, No. 12, p. 1896, Dec., 1979.

Clark et al., "Pressure Sensitivity in Anistropically Etched Thin-Diaphragm Pressure Sensors", *IEEE Transactions on Electron Devices*, vol. ED-26, No. 12, p. 1887, Dec., 1979.

(List continued on next page.)

*Primary Examiner*—Michael Messinger
*Attorney, Agent, or Firm*—Leonard Bloom

[57] ABSTRACT

A method and apparatus for sensing electric and electromagnetic fields incorporating a fiber-optic transducer which mounts directly on a conventional optical fiber waveguide. The transducer employs a conductive Fabry-Perot microcavity bounded by a conductive, thin and corrugated diaphragm. When the conductive microcavity is placed in an electric field, the electric field is excluded from within the equipotential microcavity and a net electrostatic force acts on the diaphragm. Likewise, when the conductive microcavity is exposed to an electromagnetic wave, the wave exerts a radiation pressure on the diaphragm. In both cases, the diaphragm deflects linearly and uniformly under the influence of the extremely low electrostatic pressures which are induced. The diaphragm deflection modulates the reflectance within the optical fiber by varying the gap of the cavity. The change in reflected light is measured and correlated to the field strength using an improved dual-wavelength referencing technique which compensates for bending and transmission losses in the optical fiber.

34 Claims, 6 Drawing Sheets

OTHER PUBLICATIONS

Petersen, "Silicon as a Mechanical Material", *Proceedings of the IEEE*, vol. 70, No. 5, p. 420, May, 1982.

Saaski et al., "A Fiber Optic Sensing System Based on Spectral Modulation", *ISA Paper 86-2803*, 1986.

Lieberman et al., "An Improved Interferometric Pressure Optrode", *Proceedings of the Society for Optical Engineering*, vol. 838, p. 49, Aug., 1987.

Jerman, "The Fabrication and Use of Micromachined Corrugated Silicon Diaphragms", *Sensors and Actuators*, A21–A23, p. 988, 1990.

Jerman et al. "Miniature Fabry–Perot Interferometers Micro-machined in Silicon for use in Optical Fiber WDM Systems", IEEE; May 1991, pp. 372–375.

ELECTRIC AND ELECTROMAGNETIC FIELD SENSING SYSTEM INCLUDING AN OPTICAL TRANSDUCER

BACKGROUND OF THE INVENTION

1. Field of the Invention

The present invention relates to the measurement of electrostatic field strength, and more particularly, to a fiber-optic sensor incorporating a conductive Fabry-Perot microcavity bounded by a thin conductive diaphragm for measuring the strength of electric and electromagnetic fields.

2. Description of the Background

The monitoring of electric fields in high voltage high-power equipment is of fundamental importance in the power industry. Both AC and DC fields must be measured in many high-voltage components in order to understand their operation, and to prevent or repair malfunctions. The need for monitoring has become especially apparent in recent months as a result of the public concern over radiation from high-power transmission lines.

Consequently, there exists a considerable demand for an unobtrusive, accurate and inexpensive electric field sensor which is dielectric or otherwise immune to electromagnetic interference.

Recent efforts to fulfil the demand have turned to fiber optic technology for its superior sensitivity, wide dynamic range, and immunity to electromagnetic interference.

For example, U.S. Pat. No. 4,933,629 issued to Kozuka, et al., discloses an optical fiber sensing device for measuring AC magnetic quantities based on the Faraday effect. Light is passed through a Faraday cell which phase-modulates the light in proportion to a surrounding magnetic field. The strength of the AC field can be calculated from the amount of phase modulation.

Similar interferometric electric field sensors have been proposed, for example, U.S. Pat. No. 4,899,042 issued to Falk, et al., U.S. Pat. No. 4,477,723 issued to Carome, et al., U.S. Pat. No. 4,631,402 issued to Nagatsuma, et al., and U.S. Statutory Invention Registration No. H371 issued to Bobb, all of which generally employ phase modulation to measure electric field strengths. However, the measurements carried out by the above-described devices are based on electro-optic phenomena such as the Pockel's and piezoelectric effects. Sensors based on electro-optic phenomena are unusually bulky and are highly prone to ambient temperature and pressure variations. It would be more advantageous to provide a fiber-optic sensor based on electrostatic force effects. This would eliminate the susceptibility to temperature and pressure variations. However, the electrostatic forces which result from electric fields are very weak and difficult to measure with accuracy. Currently available field-sensitive elements lack the necessary sensitivity, and they exhibit a non-linear response to varying fields. The non-linearity prevents an accurate relative measurement. The problem becomes especially severe for weak electric fields.

The problem of non-linearity arose previously in a different context. Researchers first began to exploit the mechanical properties of silicon during the integrated circuits revolution by developing microsensors to measure pressure. The development efforts led to a variety of thin film diaphragms which converted pressure to a proportionate electrical signal. For example, A. D. Kurtz, et al. (U.S. Pat. No. 3,654,579) disclose a piezoresistive pressure transducer employing a thin film diaphragm which is displaced by pressure. The displacement alters the resistivity of the transducer, and the change in resistivity is measured electronically. The thin film diaphragm improved the linearity of response to changing pressure.

Near perfect linearity was later achieved through the use of convoluted diaphragms, such as that disclosed in U.S. Pat. No. 4,467,656 issued to Mallon, et al. As shown in FIG. 1, the Mallon, et al. device is a pressure-sensing diaphragm formed with a plurality of concentric recesses or corrugations. As the piezoresistive diaphragm is displaced, the corresponding change in resistance can be measured at terminals 50 and 51. The corrugations significantly improve the linearity of response to pressure. The improved response allows a more accurate relative determination of pressure. Moreover, the corrugations can easily be produced on thin silicon diaphragms by conventional etching and diffusing techniques.

It would be greatly advantageous to employ corrugated diaphragm technology in developing an electrostatic force-effect sensor capable of linear modulation of light in a Fabry-Perot cavity connected to an optical waveguide, to improve thereby the accuracy of electric field measurement while reducing ambient pressure and temperature effects.

SUMMARY OF THE INVENTION

It is, therefore, an object of the present invention to provide a fiber-optic transducer employing an electrostatic force-sensitive diaphragm for sensing the strength of an electric field.

It is another object of the invention to provide a corrugated silicon diaphragm which deflects linearly and uniformly for extremely small electrostatic forces to allow an accurate measurement of electric field strength.

It is still another object of the present invention to provide a conducting Fabry-Perot optical cavity which acts as an electrical Faraday cage in excluding any electric fields from its interior.

It is yet another object of the present invention to provide a fiber-optic silicon transducer as described above which anodically bonds adequately with glass, is amenable to batch fabrication, and which mounts directly on an optical fiber for modulating light therein in accordance with the strength of a surrounding electrical field.

It is a further object of the present invention to provide a device for sensing electric fields in the above-described manner which employs an intensity measurement based on a dual-wavelength referencing technique which accommodates transmission losses and bending of the optical fiber.

It is still a further object of the present invention to provide a device for sensing electric fields in the above-described manner which is almost entirely dielectric, introduces a minimum disturbance to a previously uniform electric field, and which can be used in a diversity of operating environments.

According to the present invention, the above-described and other objects are accomplished by providing an optical transducer formed of a conductive optical microcavity bounded by a conductive, thin, flexible diaphragm made of a material such as silicon. The transducer may be bonded directly to the tip of an optical fiber. The transducer comprises an equi-potential microcavity which excludes any internal field. Thus, there is a net electrostatic force acting on the diaphragm in the presence of a surrounding electrical field, and the diaphragm is displaced proportionately. The degree of displacement of the diaphragm can be measured by the change in back-reflected light coupled into an optical fiber. The measurement can be used to determine the relative strength of the electric field. Preferably, the diaphragm is formed with corrugations around its periphery for linearizing the range of displacement in response to very large electric field intensities. The corrugations also insure good parallelism in the central reflecting area, and isolate this region from any field fringing effects or mechanical stresses.

BRIEF DESCRIPTION OF THE DRAWINGS

Other objects, features and advantages of the present invention will become more apparent from the following detailed description of preferred embodiments and certain modifications thereof when taken together with the accompanying drawings, in which.

DETAILED DESCRIPTION OF THE PREFERRED EMBODIMENT

The present invention employs electrostatic force effects to measure electric fields. Electrostatic forces in conductors occur whenever a conductive body is placed in an electric field. The free electrons in the conductor arrange themselves to create an induced charge at the surface of the conductor. The surface charge tends to cancel the external field within the conductive body, thereby rendering the interior of the conductive body field-free. The coulombic attraction between the induced charges on the conductor and the external electric field creates an extremely small electrostatic force density $f_s$ which is normal to the surface of the conductor, where $f_s = \frac{1}{2} * \xi_0 * E^2$. Furthermore, because the force $f_s$ is proportional to the square of the field strength, the force is always directed away from the conductor (irrespective of the polarity of the electric field). It is possible to measure the force with a transducer comprising a Fabry-Perot microcavity bounded by an extremely sensitive diaphragm which reflects light. The transmissivity (or reflectivity) of optical microcavities is highly sensitive to changes in the length of the cavity, and changes in the length are caused by the force imposed on the diaphragm by the external electric field.

Figure 1:
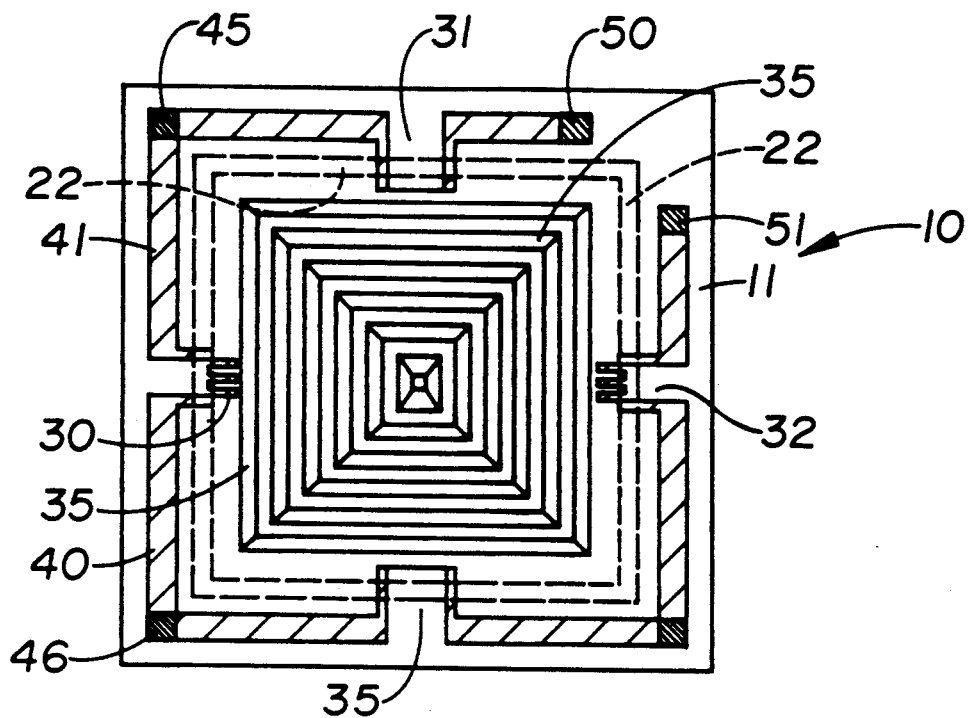
FIG. 1 illustrates a prior art transducer employing a convoluted semi-conductor diaphragm.
Figure 2:
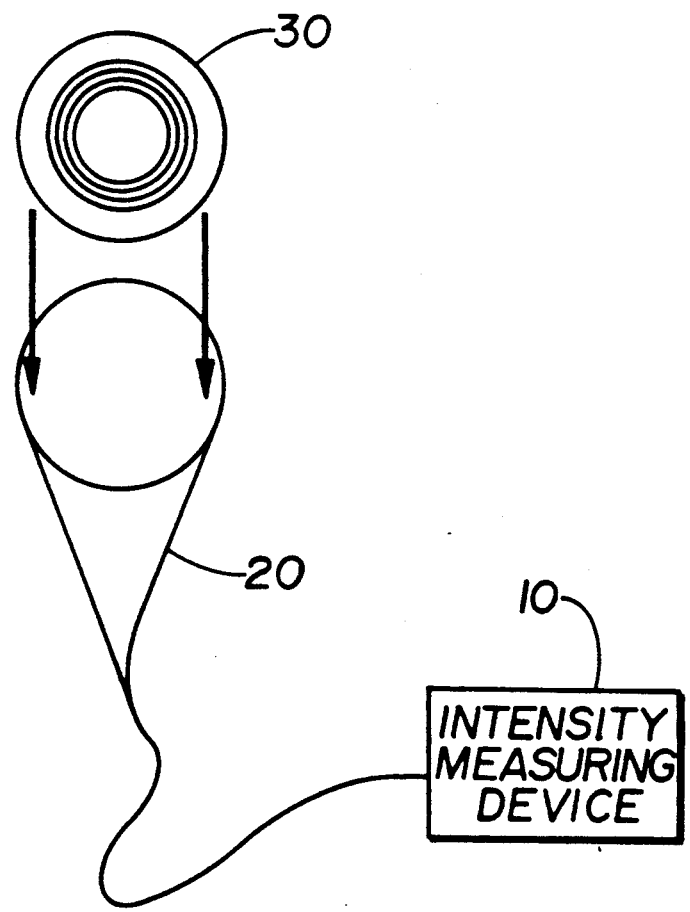
FIG. 2 is a perspective drawing of a fiber optic sensor according to the present invention.

FIG. 2 is a perspective diagram of a fiber-optic sensing system incorporating a diaphragm transducer 30 according to the present invention. Transducer 30 is preferably formed entirely of silicon. Alternatively, any other material known in the art which is amenable to silicon micro-machining techniques, and which is conductive or capable of being coated with a conductive film may be used.

Transducer 30 is hermetically mounted directly on one end of a conventional optical fiber 20. The other end of optical fiber 20 is coupled to an intensity measuring device 10 which is to be described.

Figure 3:
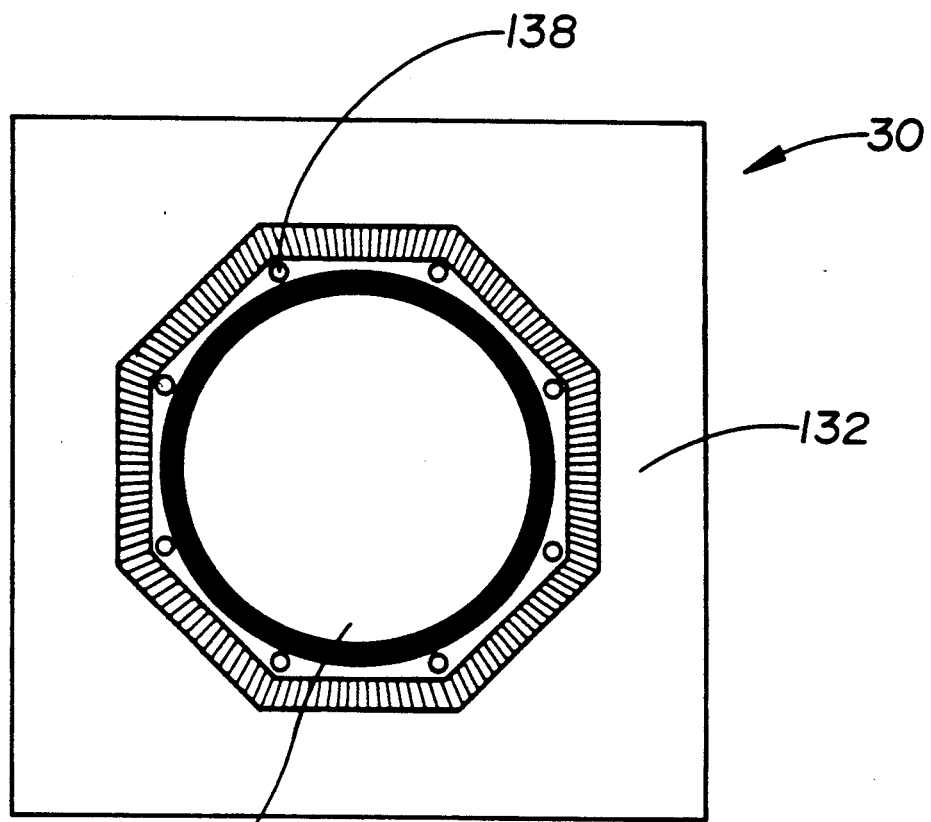
FIG. 3 is a top view of the corrugated diaphragm transducer according to the present invention.
Figure 4:
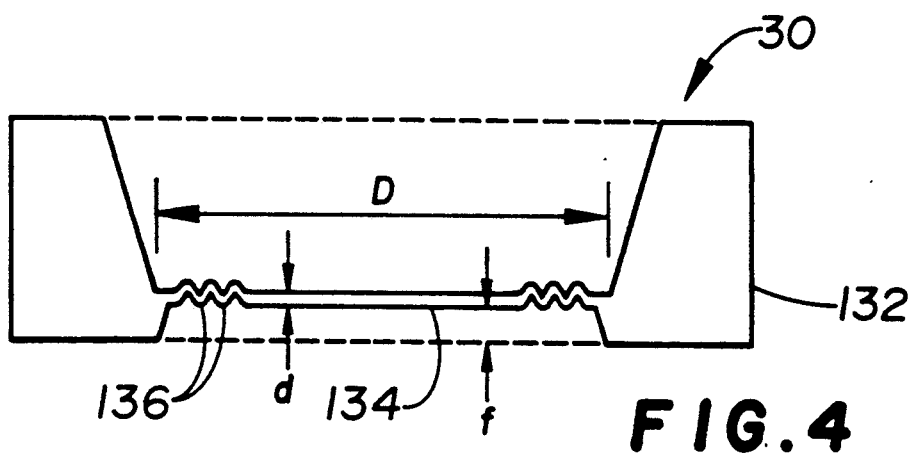
FIG. 4 is a cross-section of the corrugated diaphragm of FIG. 3.

FIGS. 3 and 4 illustrate a close-up top view and side view, respectively, of the corrugated diaphragm transducer 30 according to the present invention. Transducer 30 further comprises an annular rim 132. The inner surface of rim 132 tapers to a thin circular silicon diaphragm 134. Transducer 30 may alternatively be formed in another shape, such as a square or rectangle.

Diaphragm 134 is formed integrally with rim 132 by conventional photolithographic and micro-machining techniques such as anisotropic etching, plasma etching, reactive etching or sputter etching. For example, the diaphragm 134 can be formed by plasma etching a small recession in the epi side of a silicon wafer.

A number of channels should then be etched to provide an outlet from the microcavity for equalizing pressure and to minimize thin gas-film damping effects. Alternatively, relief holes 138 can be etched through diaphragm 134 to accomplish this same purpose. A series of grooves are etched into the wafer to define the top side of the corrugations 136. Boron diffusion is introduced in the recession to provide an etch-stop. Since the boron diffusion conforms to the corrugations, etching of the reverse side will yield the transducer of FIGS. 3 and 4.

Preferably, the transducer 30 is dimensioned with a diaphragm 134 having a thickness d between approximately two to ten micrometers. The depth f of the microcavity should be approximately one to two micrometers. The diameter of diaphragm 134 should be between 1 to 10 millimeters, depending on the desired sensitivity. A rim 132 of adequate size should be left to provide a stable bonding surface. The transducer 30 may include any number of corrugations 136, depending on the desired sensitivity (the greater the number, the larger the deflection of the diaphragm 134).

Figure 5:
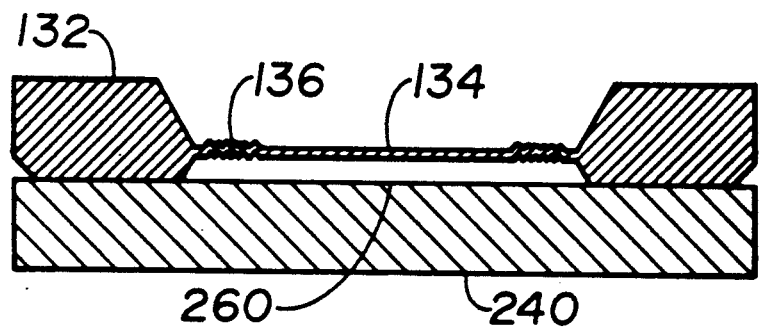
FIG. 5 is a cross-section of the conductive Fabry-Perot microcavity bounded on top by the corrugated diaphragm of FIG. 3.

As shown in FIG. 5, the transducer 30 is anodically bonded to a pyrex or any other glass substate amenable to anodic bonding 240 on which a semi-reflective aluminum film 260 has been previously evaporated. At a bonding temperature of approximately 400° C. there is a good solid solubility transformation between the doped silicon and the aluminum, which results in a reliable ohmic contact between the semiconductor and aluminum.

Figure 6:
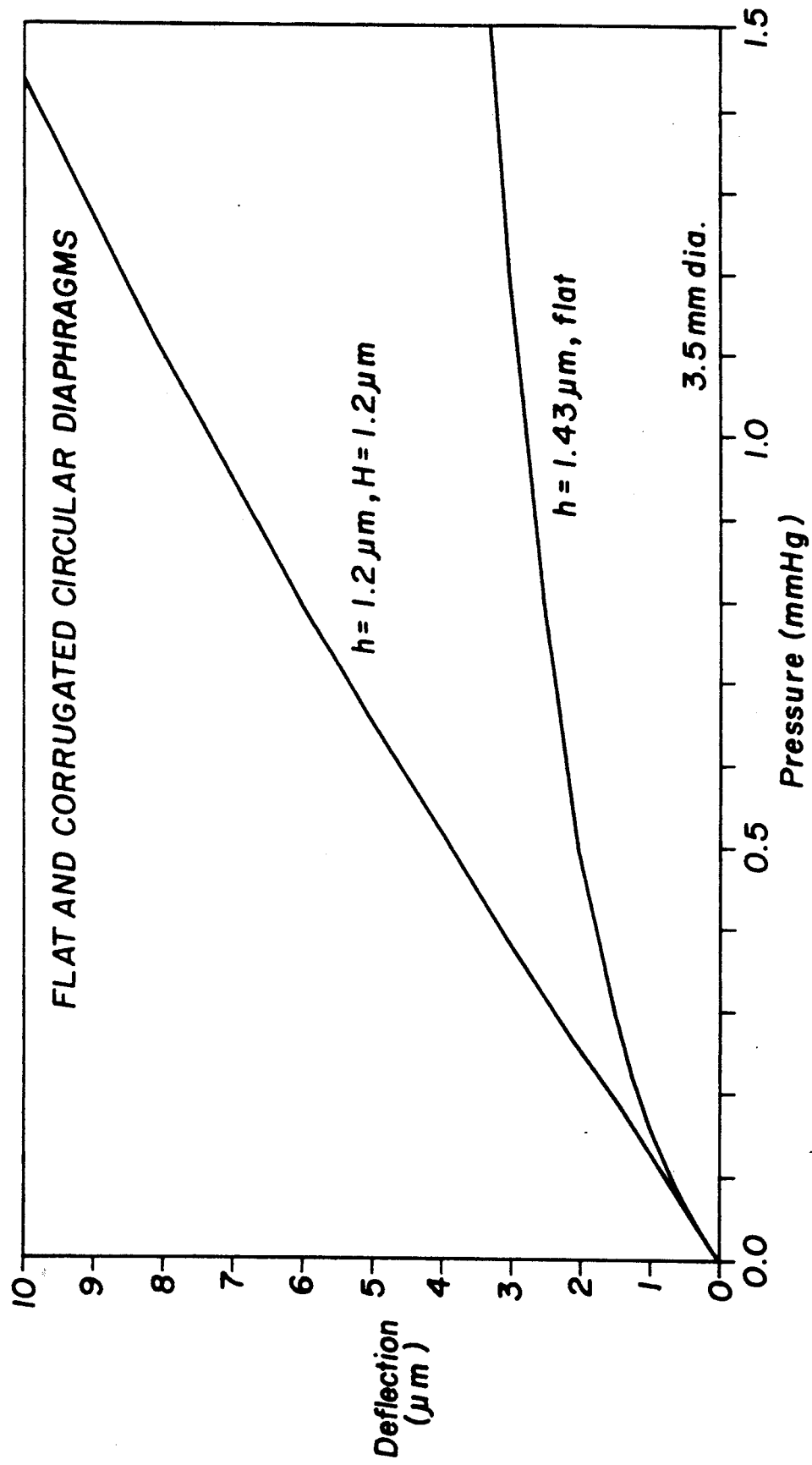
FIG. 6 illustrates the graphical results of a study on the deflection characteristics of corrugated and non-corrugated diaphragms. The results were obtained from J. H. Jerman, *The Fabrication and Use of Micromachined Corrugated Silicon Diaphragms*, Sensors and Actuators, Proceedings from the Fifth International Conference on Solid State Sensors, Actuators and Neurosensors 3, Volume 823, Nos. 1-3 (April 1990).

The corrugations 136 of diaphragm 134 according to the present invention solve the problem of non-linearity by increasing the range of linear deflection of diaphragm 134, and by helping it to move in a piston-like fashion. In demonstration of the improvement, a circular diaphragm having a diameter of 4.2 millimeters and a thickness of 3.0 micrometers was tested with and without corrugations in a study appearing in J. H. Jerman, *The Fabrication and Use of Micromachined Corrugated Silicon Diaphragms, Sensors and Actuators*, Proceedings from the Fifth International Conference on Solid State Sensors, Actuators and Neurosensors 3, Volume 823, Nos. 1-3 (April 1990). FIG. 6 illustrates the deflection characteristics for both of the tested diaphragms. The response curve for the flat diaphragm is shown in curve A, while the response curve for the corrugated diaphragm is shown by curve B. Clearly, the response curve is significantly more linear for the corrugated diaphragm. The convolutions prevent stretching of the diaphragm as larger displacements occur, and they increase the sensitivity to extremely low electrostatic pressures of between 0–440 Pa, which corresponds to the sensing of electric fields in the 0–100 kV/cm range. In short, the convolutions increase linearity across the entire spectrum of responses.

Figure 7:
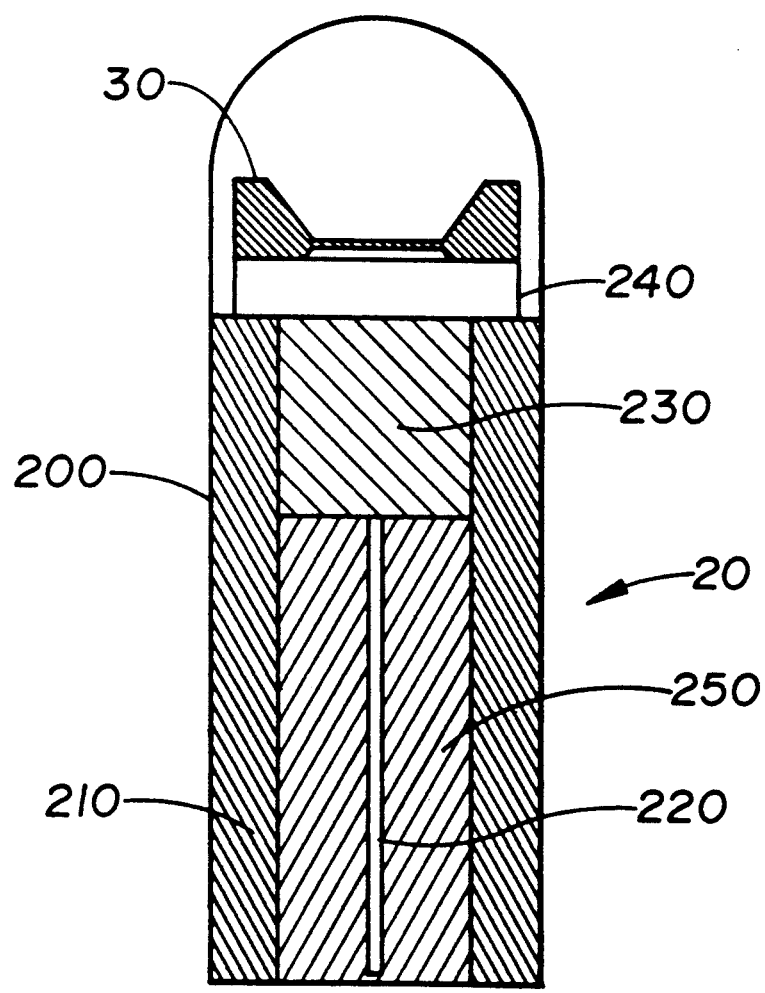
FIG. 7 is a cross-section of the Fabry-Perot microcavity of FIG. 4 shown mounted on an optical fiber.

FIG. 7 illustrates the preferred means by which transducer 30 and pyrex substrate 240 are attached to the tip of optical fiber 20. The transducer 30 and pyrex substrate 240 are glued to a glass pedestal 210. In the preferred embodiment, a sealed glass tube 200 is slid over top of the assembly to protect against mechanical damage. A conventional optical fiber 250 including a GRIN lens 230 and a microcapillary tube 220 are then inserted within the pedestal 210.

Since the above-described microcavity is formed by a highly-doped silicon well and an aluminum film which are both conductive at low frequencies, the microcavity acts as a narrow Faraday cage which is free of any internal electric field. Hence, a net negative electrostatic pressure will be exerted on the top surface of the diaphragm 134. The central diaphragm 134 will move as a piston and any fringing effects present at the edges will not effect the displacement.

Because of the almost entirely dielectric construction and compact size of the probe, there is little in the way of electric field disturbance or other detrimental effects such as electric breakdown, discharges or flashovers. Moreover, since the probe includes a protective cover, it becomes possible to use the probe in the harshest of environments (such as, for instance, the interior of an oil-insulated high-voltage transformer).

Figure 8:
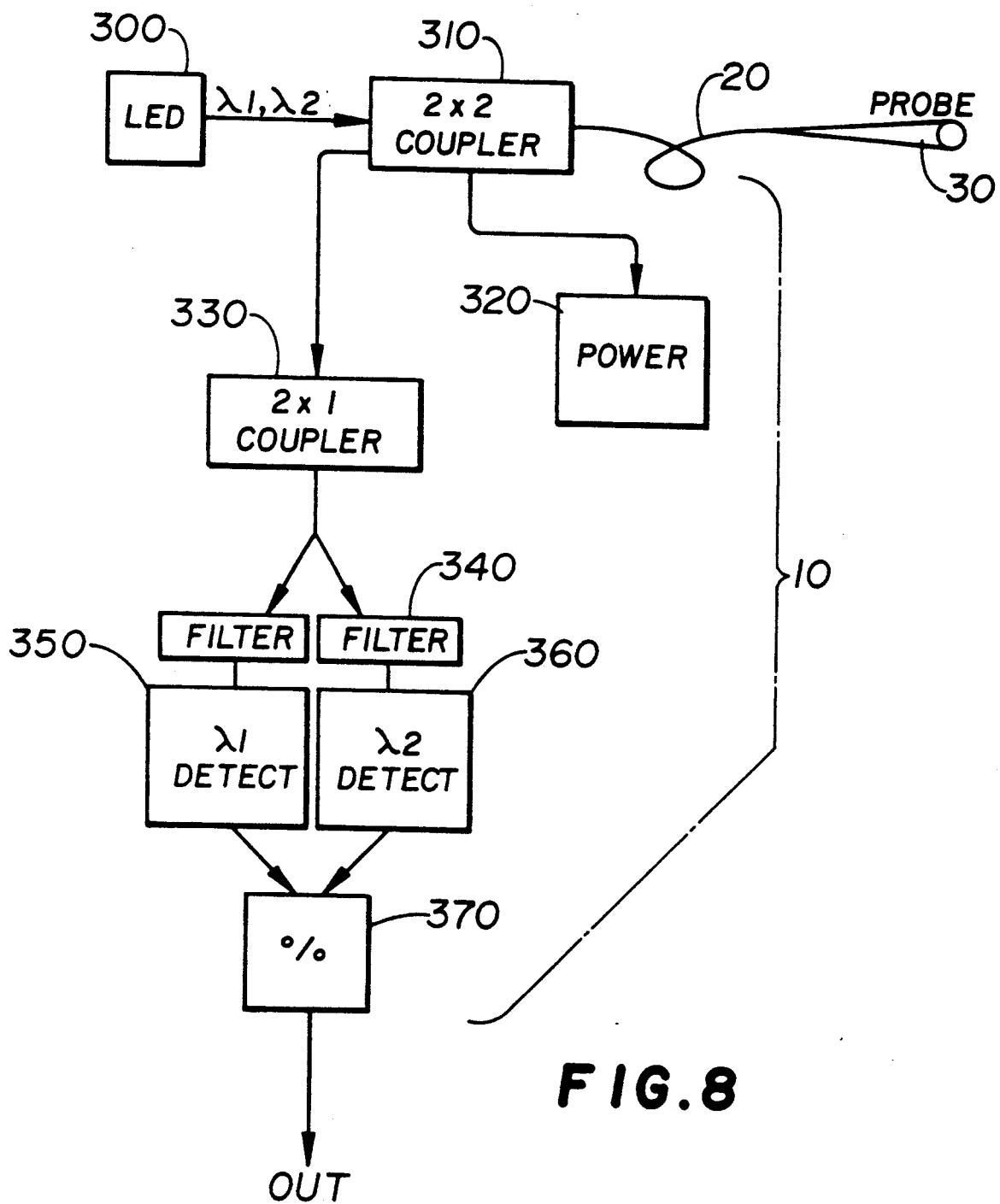
FIG. 8 is a block diagram of the electric field sensing system according to the present invention.

FIG. 8 illustrates the device of FIGS. 3-5 connected to an intensity measuring device 10 according to the present invention.

Measurement device 10 includes a standard LED or laser diode optically connected to a conventional 2×2 optical fiber coupler 310, which is in turn connected through conventional fiber 20 to the above-described probe sensor. The 2×2 optical fiber coupler 310 is connected to a 2×1 optical fiber coupler 330, which splits the optical path. The dual optical path continues through a pair of differential narrow-band filters 340. Each filter 340 allows a specific wavelength of reflected light to pass. Each channel from filters 340 is respectively coupled to an individual pair-matched silicon detector 350 and 360, which measures the intensity of reflected light. The dual outputs from detectors 350 and 360 are both input to a circuit 370 which calculates the ratio of the two intensities. Circuit 370 may be any analog or digital arithmetic processing circuit, for instance, an arrangement of logarithmic amplifiers.

The operation of the electric field sensing system according to the present invention will now be discussed with reference to FIG. 8.

LED 300 transmits light to 2×2 optical fiber coupler 310 and through fiber 20 into the probe sensor. The light is collimated into the microcavity by GRIN lens 230, and is reflected by the polished surface of the silicon transducer 30 and the aluminum film 260 on the pyrex substrate 240.

As the depth f of the microcavity changes under the influence of negative electrostatic pressure from the electric field, the intensity of the back-reflected light into the optical fiber 20 will likewise change. The reflectance of the Fabry-Perot microcavity is a function of spacing, index and refraction, reflectivities of the diaphragm 134 and glass substrate 240, and the wavelength of light. Assuming an optically loss-less diaphragm 134 and glass substrate 240, the reflected intensity $(I_r/I_0)$ as follows:

$$\frac{I_r}{I_0} = \frac{4\sqrt{R_1 R_2}\sin^2\left(2\pi\frac{h}{\lambda}\right)}{(1-\sqrt{R_1 R_2})^2 + 4\sqrt{R_1 R_2}\sin^2\left(2\pi\frac{h}{\lambda}\right)} \quad (1)$$

with $$h = h^0 + \delta h \quad (1a)$$

where R1 and R2 are the diaphragm and aluminum film reflectivities, respectively, $\mp_0$ is the height of the unperturbed cavity, and $\delta \mp$ is the deflection of a bossed, corrugated membrane given by the expression:

$$\delta h = \frac{\epsilon P R^4}{E' t^3} \quad (2)$$

where $$\epsilon = \frac{3\left(1 - \frac{\nu^2}{q^2}\right)(1 - r^4)}{2(q+3)(q+1)}\left(1 - \frac{8qr^4(1 - r^{q-1})(1 - r^{q-3})}{(q-1)(q-3)(1 - r^4)(1 - r^{2q})}\right) \quad (2a)$$

and for the case of shallow corrugations $$q = \sqrt{1 + 1.5\frac{H^2}{t^2}} \quad (2b)$$

where P is the differential pressure, R is the diaphragm radius, r is the boss to diaphragm radius ratio, $E' = E/(1-\nu^2)$ is the plate modulus of elasticity, $\nu$ is Poisson's ratio, t is the thickness, H the corrugation depth, and q the corrugation quality factor.

The back-reflected light is transmitted back through 2×2 coupler 310, and its intensity is measured using a dual-wavelength referencing technique designed to make the measurement immune to transmission losses or bending of the fiber 20, or degradation of the light source. More specifically, the light is sent to 2×1 coupler 330, where it is split. The two channels of light are each filtered by respective narrow-band filters 340, and two distinct wavelengths are allowed to pass. The intensity of the two wavelengths is measured at respective detectors 350 and 360, and the pair of measurements is input to logic circuit 370 which calculates the ratio of the two measurements. The intensity ratio of the two wavelengths is independent of all transmission effects since both wavelengths undertook the same path. Hence, the ratio can be compared to a look-up table or otherwise used to accurately determine the strength of the electric field.

Figure 9:
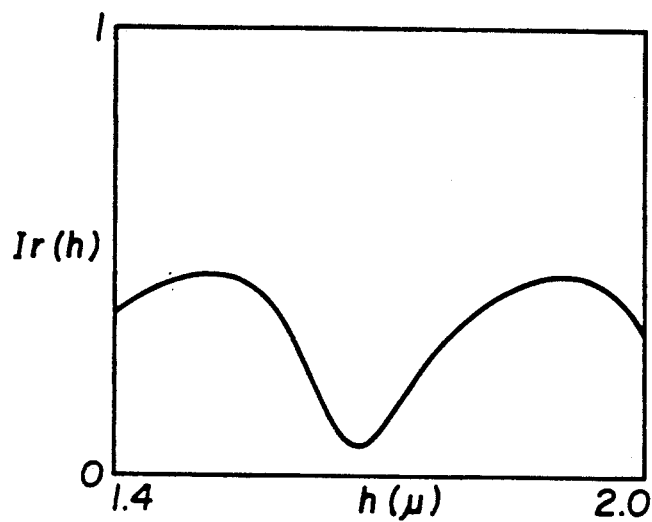
FIG. 9 illustrates the reflectance spectrum as a function of diaphragm 134 deflection h (in micrometers) for a transducer 30 in accordance with the present invention.

FIG. 9 illustrates the reflectance spectrum as a function of diaphragm 134 deflection h (in micrometers) for a transducer 30 having the following specifications:

Material: silicon
Diameter of microcavity: 4 mm
Depth of microcavity: 1.4 micrometers
thickness of diaphragm 134: 3.5 micrometers
reflectivity of diaphragm 134: 20%
reflectivity of aluminum film: 35%
wavelength of light: 800 nanometers
number of corrugations: 7

Figure 10:
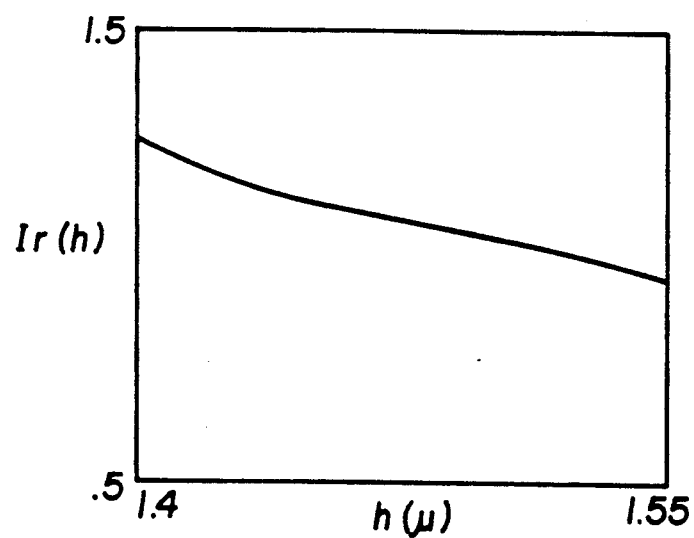
FIG. 10 is a reflectance spectrum as measured by the dual-wavelength reference technique according to the present invention.

Clearly, the sinusoidal shape would make it difficult to determine the degree of deflection. However, use of the dual wavelength referencing technique as described above leads to a linear curve as shown in FIG. 10. From this, the degree of deflection can be accurately determined, and the intensity of an external electric field can be ascertained.

The above-described electric field sensor can also be used as an electromagnetic wave sensor. More specifically, when an electromagnetic wave impinges upon a good conductor, the electric field $E_0$, in the conductor gives rise to a current density equal to $\sigma E_0$, where $\sigma$ is the conductivity of the medium. The current density is in the same direction as the electric field, said direction being perpendicular to the magnetic field $H_0$ of the incident wave. The current interacts with $H_0$ resulting in a Lorentz force in the direction of propagation of the wave. Thus, there is an instantaneous radiation pressure exerted by the electromagnetic wave on a conductor sheet of thickness t of magnitude $\sigma \mu_0 E_0 H_0 t$. Furthermore, since the product $E_0 H_0$ is proportional to the Poynting vector, a measurement of the average radiation pressure can be correlated to the average power carried by the wave. The calculated value of the average radiation pressure is equal to $nE_{2p}H_p/c$; where n is the refractive index of the exterior medium, $E_{2p}$ and $H_p$ the peak amplitudes of the field components, and c the speed of light. The average pressure thus has the same magnitude at all depths within the conductor. The magnitudes of the radiation pressures are compatible to those induced by the electric fields. Therefore, no significant modification to the electric field sensor is necessary in order to operate as an effective electromagnetic wave sensor. As in the case of the electric field sensor, the diaphragm 134 will deform under the influence of radiation pressures. Similarly, this will de-tune the Fabry-Perot microcavity 30 and will change the reflectance of the light coupled into an optical fiber 220. The change in reflected light is measured and correlated to the average power in the wave using the dual-wavelength referencing detection apparatus 10.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. It is to be understood, therefore, that within the scope of the appended claims, the invention may be practiced otherwise than as specifically set forth herein.

We claim:

1. An optical electric and electromagnetic field transducer, comprising:

light source means for emitting input measuring light of at least two wavelengths;

an optical fiber coupled to said light source means for receiving light of at least the two wavelengths;

a conductive optically resonant cavity free of any internal electric field;

an electrostatic force-sensitive diaphragm bonding said conductive optically resonant miniature cavity, said diaphragm being connected to said optical fiber for modulating light propagating therein, said diaphragm having a degree of deformation in electric and electromagnetic fields corresponding to an intensity of said fields, whereby said degree of deformation is measurable from change in light intensity resulting from constructive interference of reflected light beams coming from said conductive optically resonant cavity.

2. The optical electrical and electromagnetic field transducer according to claim 1, further comprising a sodium-bearing glass substrate amenable to anodic bonding techniques, said electrostatic force-sensitive diaphragm being bonded to said glass substrate.

3. The optical electric and electromagnetic field transducer according to claim 2, further including a conductive, reflective coating on said diaphragm.

4. The optical electric and electromagnetic field transducer according to claim 2, further comprising a conductive, semi-transparent coating on said glass substrate.

5. The optical electric and electromagnetic field transducer according to claim 2, wherein said diaphragm is of one material selected from among the group consisting of silicon, silicon nitride and silicon dioxide.

6. The optical electric and electromagnetic field transducer according to claim 2, further including a spacer formed integrally with said diaphragm, said spacer having a central hollow covered by said diaphragm to form said conductive optically resonant cavity when bonded to said substrate.

7. The optical electric and electromagnetic field transducer according to claim 2, wherein said diaphragm has peripheral corrugations for maintaining a linear proportion between said degree of deformation and field intensity squared.

8. The optical electric and electromagnetic field transducer according to claim 5, wherein said diaphragm includes peripheral corrugations for maintaining a linear proportion between said degree of deformation and field intensity squared.

9. The optical electric and electromagnetic field transducer according to claim 7, wherein said diaphragm having the peripheral corrugations deflects linearly and uniformly for electrostatically induced pressured of between approximately 0 to approximately 440 Pa.

10. The optical electric and electromagnetic field transducer according to claim 7, wherein said diaphragm having the peripheral corrugations further has a plurality of radial channels for equalizing pressure in said conductive optically resonant cavity and for minimizing viscous damping effects.

11. The optical electric and electromagnetic field transducer according to claim 7, wherein said diaphragm having the peripheral corrugations further has a plurality of through-holes for equalizing pressure in said conductive optically resonant cavity and for minimizing viscous damping effects.

12. The optical electric and electromagnetic field transducer according to claim 7, wherein said conductive optical resonant cavity has a diameter of from about 1 to about 10 millimeters, and a height of from about 1 to about 2 micrometers.

13. The optical electric and electromagnetic field transducer according to claim 7, wherein said degree of deformation of said diaphragm corresponds to field intensity, the intensity being determined by measuring variations in light resulting from the constructive interference of the reflected light beams coming from said conductive optically resonant cavity which are coupled into said optical fiber.

14. The optical electric and electromagnetic field transducer according to claim 13, wherein said degree of deformation of said diaphragm corresponds to electric field intensity.

15. The optical electric and electromagnetic field transducer according to claim 14, wherein height of said conductive optically resonant cavity constitutes an interferometric measurement.

16. The optical electric and electromagnetic field transducer according to claim 6, wherein said spacer and diaphragm are circular.

17. The optical electric and electromagnetic field transducer according to claim 6, wherein said spacer and diaphragm are rectangular.

18. The optical electric and electromagnetic field transducer according to claim 6, wherein said spacer and diaphragm are quadrangular.

19. An electric and electromagnetic field sensor, comprising:
light source means for emitting input measuring light of at least two wavelengths;
an optical fiber coupled to said light source means for receiving light of at least the two wavelengths;
a conductive optically resonant miniature cavity free of any internal electric field;
electrostatic force-sensitive transducing means bounding said conductive optically resonant miniature cavity, said transducing means being connected to said optical fiber for reflecting light propagating therein, said transducing means having a degree of deformation in electric and electromagnetic fields corresponding to an intensity of said fields, whereby said degree of deformation is measurable from change in light intensity in said optical fiber resulting from constructive interference of reflected light beams coming from said conductive optically resonant miniature cavity.

20. The electric and electromagnetic field sensor according to claim 19, wherein said electrostatic force-sensitive transducing means comprises an electrostatic force-sensitive diaphragm.

21. The electric and electromagnetic field sensor according to claim 20, further comprising a glass substrate, said electrostatic force-sensitive diaphragm being bonded to said glass substrate.

22. The electric and electromagnetic field sensor according to claim 21, further comprising a conductive, semi-transparent coating evaporated onto said glass substrate.

23. The electric and electromagnetic field sensor according to claim 20, wherein said diaphragm is of silicon.

24. The electric and electromagnetic field sensor according to claim 21, further comprising a spacer formed integrally with said diaphragm and bonded to said glass substrate, said spacer having a central hollow covered by said diaphragm forming said conductive optically resonant miniature cavity.

25. The electric and electromagnetic field sensor according to claim 21, wherein said diaphragm has peripheral corrugations for maintaining a linear proportion between said degree of deformation and field intensity squared.

26. The electric and electromagnetic field sensor according to claim 25, wherein said diaphragm having the peripheral corrugations further has a plurality of radial channels for equalizing pressure in said conductive optically resonant miniature cavity and for minimizing viscous damping effects.

27. The electric and electromagnetic field sensor according to claim 25, wherein said diaphragm having the peripheral corrugations further has a plurality of through-holes for equalizing pressure in said conductive optically resonant miniature cavity and for minimizing viscous damping effects.

28. The electric and electromagnetic field sensor according to claim 21, further comprising a graded index lens between said glass substrate and said optical fiber.

29. The electric and electromagnetic field sensor according to claim 23, wherein said electrostatic force-sensitive transducing means further comprises a housing protecting said diaphragm of silicon.

30. The electric and electromagnetic field sensor according to claim 29, wherein said housing further comprises a collar for reinforcing said optical fiber at an end proximate said transducing means.

31. The electric and electromagnetic field sensor according to claim 30, wherein said housing further comprises a transparent tube having an open end slidable onto said collar, and a closed and encasing said diaphragm for protection thereof.

32. An electric and electromagnetic field sensing system, comprising:
light source means for emitting input measuring light of at least two wavelengths;
an optical fiber coupled to said light source means for receiving light of at least the two wavelengths;
a conductive optically resonant cavity free of any internal electric field;
electrostatic force-sensitive transducing means bounding said conductive optically resonant cavity, said transducing means being connected to one end of said optical fiber for reflecting light propagating therein, said transducing means having a degree of deformation in electric and electromagnetic fields corresponding to an intensity of said fields, whereby said degree of deformation is measurable from change in light intensity resulting from constructive interference of reflected light beams coming from said conductive optically resonant cavity; and intensity measuring means coupled to another end of said optical fiber for measuring light intensity of light in said optical fiber reflected from said transducing means to determine amount of electrostatic force acting on said transducing means.

33. The electric and electromagnetic field sensing system according to claim 32, wherein said electrostatic force-sensitive transducing means comprises a corrugated diaphragm, a spacer formed integrally with said diaphragm, and a glass substrate, said spacer being bonded to said glass substrate to define said conductive optically resonant cavity as a Fabry-Perot microcavity between said corrugated diaphragm and said glass substrate.

34. The electric and electromagnetic field sensing system according to claim 33, wherein said intensity measuring means further comprises, a first coupler optically connected between said light source means and said transducing means for diverting light reflected from said transducing means, a second coupler connected to said first coupler for dividing said diverted light along a first optical path and a second optical path, a first filter optically coupled to said second coupler for passing light of a first predetermined one of said at least two wavelengths, a second filter optically coupled to said second coupler for passing light of a second predetermined one of said at least two wavelengths, a first detector optically coupled to said first filter for measuring an intensity of light passed thereby, a second detector optically coupled to said second filter for measuring an intensity of light passed thereby, and means connected to said first and second detectors for calculating a ratio of intensities of light passed by said first and second filters.

* * * * *